(12) United States Patent
Yoo et al.

(10) Patent No.: US 11,049,957 B1
(45) Date of Patent: Jun. 29, 2021

(54) LDMOS DEVICE WITH SINKER LINK

(71) Applicant: Monolithic Power Systems, Inc., San Jose, CA (US)

(72) Inventors: Ji-Hyoung Yoo, Los Gatos, CA (US); Yanjie Lian, Chengdu (CN); Daping Fu, Chengdu (CN); Jin Xing, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 16/851,063

(22) Filed: Apr. 16, 2020

(51) Int. Cl.
| | | |
|---|---|---|
| *H01L 21/00* | (2006.01) | |
| *H01L 29/66* | (2006.01) | |
| *H01L 29/06* | (2006.01) | |
| *H01L 21/02* | (2006.01) | |
| *H01L 21/311* | (2006.01) | |
| *H01L 29/10* | (2006.01) | |

(52) U.S. Cl.
CPC .. *H01L 29/66704* (2013.01); *H01L 21/02293* (2013.01); *H01L 21/02403* (2013.01); *H01L 21/31144* (2013.01); *H01L 29/063* (2013.01); *H01L 29/0623* (2013.01); *H01L 29/1095* (2013.01)

(58) Field of Classification Search
CPC ......... H01L 29/66704; H01L 21/02293; H01L 21/02403; H01L 21/31144; H01L 29/0623; H01L 29/063; H01L 29/1095
See application file for complete search history.

(56) References Cited

U.S. PATENT DOCUMENTS

| | | | | |
|---|---|---|---|---|
| 2014/0070315 | A1* | 3/2014 | Levy | H01L 27/0617 257/343 |
| 2016/0190310 | A1* | 6/2016 | Yu | H01L 29/7816 257/339 |
| 2019/0088554 | A1* | 3/2019 | Agam | H01L 29/402 |

* cited by examiner

*Primary Examiner* — Richard A Booth
(74) *Attorney, Agent, or Firm* — Perkins Coie LLP

(57) ABSTRACT

An LDMOS device with sinker link. The LDMOS device has a buried layer, a first well region and a sinker linking the buried layer and the first well region. The LDMOS device has a trench with its upper portion surrounded by the first well region and its lower portion surrounded by the sinker. The trench is formed so that the sinker can be formed by ion implantation through the trench. The trench is filled with non-conductive material.

7 Claims, 5 Drawing Sheets

LDMOS DEVICE WITH SINKER LINK

FIELD

The present invention relates to power devices, more specifically, the present invention relates to LDMOS devices.

BACKGROUND

LDMOS devices are popularly used in switching mode power supplies because of their good performances. RESURF (Reduced Surface Field) technology is one of the most popular ways to get a higher breakdown voltage and a lower specific on-resistance in a given dimension in modern LDMOS devices. A RESURF layer is a P-type implant layer under a drain drift region in an N-type LDMOS device and this RESURF layer is usually formed by high energy implant. For an LDMOS device, especially for a highside LDMOS device which is used as a highside switch in a switching mode power supply, the RESURF layer usually sits on an NBL (N-type buried layer) or a highly doped N-type layer in order to isolate a body and the RESURF layer from a substrate of the LDMOS device. In such a structure, the RESURF layer sees two N-type layers: the drain drift layer on top of the RESURF layer and the NBL (or the highly doped N-type layer) under the RESURF layer, and accordingly, a first P-N junction is formed between the RESURF layer and the drain drift layer, and a second P-N junction is formed between the RESURF layer and the NBL (or the highly doped N-type layer). These two junctions should have higher breakdown voltages than the operating voltage of the LDMOS device for a safe operation.

As a result, an epitaxial layer of the LDMOS device with the RESURF layer needs to be thicker in order to keep high breakdown voltages at these two P-N junctions. However, the thicker epitaxial layer usually faces the following issues.

First, the link between an N-type well region (or an N-sinker) and the NBL becomes harder. To help the link, either very high energy implant for the N-type well region and/or the N-sinker is needed or a long/hot thermal drive-in step is needed for the N-sinker. In many high voltage cases, high energy implant itself cannot achieve the goal so the long/hot thermal drive-in step is inevitable. However, this long/hot thermal drive-in step would cause a wide side-diffusion of the N-sinker as well as an up-diffusion of the NBL. The up-diffusion of the NBL would in turn reduce the effective thickness of the epitaxial layer. As a result, this technology would require a thicker epitaxial layer in order to compensate this thickness loss of the epitaxial layer, which thus would in turn require longer/hotter drive-in step for the N-sinker to link the N-sinker and the NBL. This positive feedback is unwanted as it increases the device size and it makes it harder to build efficient RESURF device. The technology of two epitaxial layers is another choice of linking the N-type well region and the NBL in advanced technologies. Two epitaxial layers are used to make the link between the N-type well region and the NBL easier by inserting one more N-type layer between the N-type well region and the NBL. It can reduce the thermal budget so the wide side-diffusion of the N-sinker or the up-diffusion of the NBL can be reduced. However, it has several downsides too. First, it is too expensive. Second, it has bad process controllability. The control of the thickness of the epitaxial layer and of the alignment of the masks would be tough.

Second, tub isolation would become harder as like N-sinker, P-type wells and/or P-type isolation layers need a long/hot thermal drive-in step or high energy implant.

Except the above mentioned reasons, a better and easier sinker link is always desired due to other possible reasons.

Thus, an LDMOS device at least addressing the above mentioned or other issues is needed.

SUMMARY

Embodiments of the present invention are directed to an LDMOS device, comprising: a substrate; an epitaxial layer formed on the substrate and has a top surface; a body region formed in the epitaxial layer, wherein the body region has a first side and a second side; a drain drift region formed in the epitaxial layer, wherein the drain drift region is adjacent to the body region at the first side; a gate formed on the epitaxial layer, wherein the gate covers a portion of the body region and a portion of the drain drift region; a buried layer formed in the substrate and contacting the epitaxial layer; a first well region formed in the epitaxial layer and at the second side of the body region, and wherein the first well region is separated from the body region; a sinker formed between the buried layer and the first well region and contacting the buried layer and the first well region; and a trench extending from the top surface of the epitaxial layer, through the first well region and into the sinker.

Embodiments of the present invention are further directed to method for forming an LDMOS device, comprising: forming a buried layer in a substrate; forming an epitaxial layer on the substrate; forming a pad oxide layer, a nitride layer and a photoresist layer sequentially on the epitaxial layer; etching the photoresist layer with a mask layer having an opening; forming a trench by etching the nitride layer, the pad oxide layer and the epitaxial layer through the etched portion of the photoresist layer; forming a sinker by implanting ions through the sidewalls and the bottom side of the trench; filling the trench with a non-conductive material; forming a drain drift region above the buried layer; forming a first well region surrounding the upper portion of the trench; forming a body region adjacent to the drain drift region and separated from the first well region; and forming a gate on the epitaxial layer.

The use of the similar reference label in different drawings indicates the same of like components.

DETAILED DESCRIPTION

Embodiments of circuits for LDMOS device are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
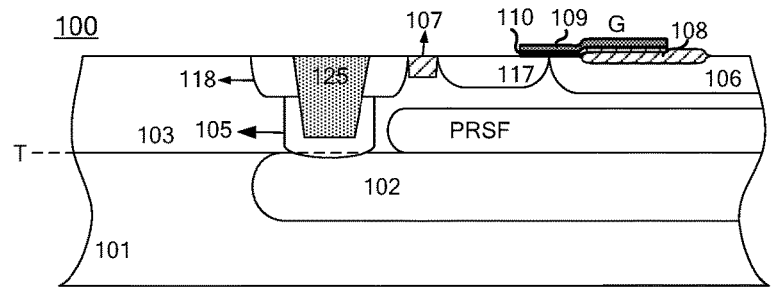
FIG. 1 illustratively shows a cross-section view of an LDMOS device 100 in accordance with an embodiment of the present invention.

FIG. 1 illustratively shows a cross-section view of an LDMOS device 100 in accordance with an embodiment of the present invention. In the embodiment of FIG. 1, the LDMOS device 100 comprises: a substrate 101 with P-type doping; an N-type buried layer (NBL) 102 formed in the substrate 101; an epitaxial layer 103 with P-type doping formed on the substrate 101; a P-type reduced surface field (RESURF) layer PRSF formed in the epitaxial layer 103, wherein the entire RESURF layer PRSF is formed on part of the N-type buried layer 102; and a drain drift region 106 with N-type doping formed in the epitaxial layer 103, wherein the drain drift region 106 is formed on part of the RESURF layer PRSF. The RESURF layer PRSF acts to isolate the drain drift region 106. In addition, the RESURF layer PRSF creates RESURF action to increase the breakdown voltage in a given drain drift region length, which helps to improve the specific on-resistance of the LDMOS device 100. In another embodiment, the RESURF layer PRSF may be omitted. In one embodiment, the RESURF layer PRSF can be formed contacting the buried layer 102 and/or the drain drift region 106, yet in another embodiment, the RESURF layer PRSF can be separated from the buried layer 102 and the drain drift region 106.

The LDMOS device 100 further comprises a body region 117 formed in the epitaxial layer 103, wherein the body region 117 has a first side and a second side and the body region 117 is adjacent to the drain drift region 106 at the first side; a gate G formed on the epitaxial layer 103 and covering a portion of the drain drift region 106 as well as a portion of the body region 117, wherein the gate G comprises a thin gate oxide 110 formed on the epitaxial layer 103 and a gate poly 109 formed on the thin gate oxide 110; a first well region 118 with N-type doping formed in the epitaxial layer 103 and at the second side of the body region 117, wherein the first well region 118 is separated from the body region 117; a sinker 105 formed between the first well region 118 and the N-type buried layer 102, wherein the sinker 105 contacts both the first well region 118 and the N-type buried layer 102; and a trench 125 extending from the top surface of the epitaxial layer 103, through the first well region 118 and into the sinker 105, wherein the trench 125 is filled with a non-conductive material. In one embodiment, the non-conductive material may be undoped poly or undoped oxide.

Figure 2:
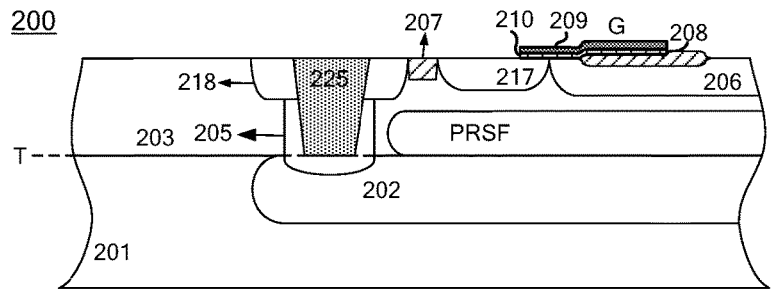
FIG. 2 illustratively shows a cross-section view of another LDMOS device 200 in accordance with an embodiment of the present invention.

Persons of ordinary skill in the art will recognize that in the embodiment illustrated in FIG. 1, the trench 125 extends into the sinker 105 and above a horizontal plane T defined by the most upper side of the N-type buried layer 102. Yet in another embodiment as shown in FIG. 2, the trench 225 extends until the horizontal plane T is reached.

In the embodiment of FIG. 1, the LDMOS device 100 may also comprise a filed region 107 formed in the epitaxial layer 103 and between the body region 117 and the first well region 118 for isolating the first well region 118 from the body region 117. In one embodiment, the field region 107 may be a shallow trench isolation (STI) structure, yet in another embodiment, the field region 107 may be formed using field oxidation.

Persons of ordinary skill in the art will recognize that although not shown in FIG. 1, the LDMOS device 100 may also comprise a drain pickup region with N-type doping formed in the drain drift region 106; a source pickup region with N-type doping and a body pickup region with P-type doping formed in the body region 117, wherein the source pickup region and the body pickup region are adjacent to each other; a well pickup region with N-type doping formed in the first well region 118; a drain electrode contacted with the drain pickup region; a source electrode contacted with the source pickup region and with the body pickup region; a well electrode contacted with the well pickup region; and a gate electrode contacted with the gate G.

Persons of ordinary skill in the art will recognize, in another embodiment, the LDMOS device 100 may also comprise a thick thermal oxide field plate 108 formed on a part of the drain drift region 106, and in such the embodiment, the thin gate oxide 110 is formed on a portion of the thick thermal oxide field plate 108 in addition to on a portion of the epitaxial layer 103.

Persons of ordinary skill in the art will recognize that FIG. 1 illustrates an N-type LDMOS device, however, the structure illustrated in FIG. 1 can be applied in a P-type LDMOS device.

In the above embodiments, with the trench 125 formed through the first well region 118 and into the sinker 105, the sinker 105 can be more easily formed by implanting ions through the bottom side and the sidewalls of the trench 125, resulting an easier and better link between the first well region 118 and the buried layer 102. This is especially useful in an LDMOS device with a thick epitaxial layer due to, for example, a RESURF layer.

FIGS. 3-13 schematically show cross-section views of a semiconductor substrate with P-type doping undergoing a process for forming an LDMOS device in accordance with an embodiment of the present invention.

Figure 3:
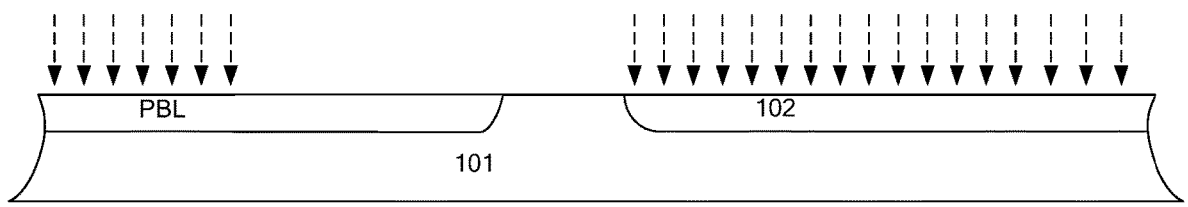
FIGS. 3-13 schematically show cross-section views of a semiconductor substrate with P-type doping undergoing a process for forming an LDMOS device in accordance with an embodiment of the present invention.

As shown in FIG. 3, the process includes forming an N-type buried layer 102 in the substrate 101. Optionally, the process may include forming a P-type buried layer PBL in the substrate 101. The step of forming the N-type buried layer 102 and/or the P-type buried layer PBL may be implemented by the ion implantation technology. And further, the thermal drive-in technology may be used together with the ion implantation technology in an embodiment.

Figure 4:
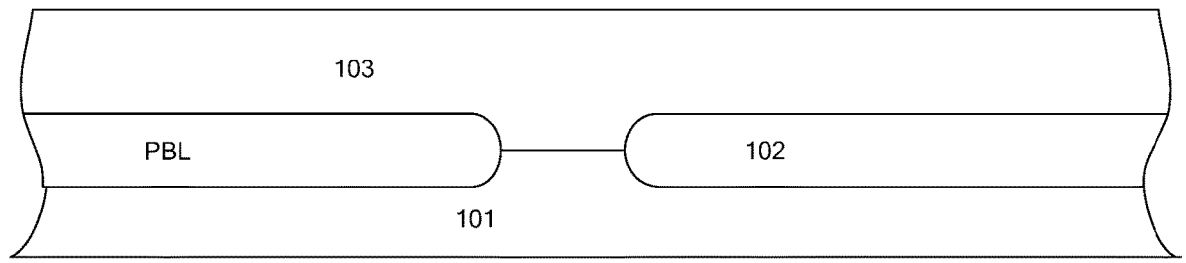

As shown in FIG. 4, the process includes forming an epitaxial layer 103 on the substrate 101. The epitaxial layer 103 has a recommended thickness of a range of 5 µm-10 µm. In one embodiment, the epitaxial layer 103 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the epitaxial layer 103 is doped with P-type impurities.

Figure 5:
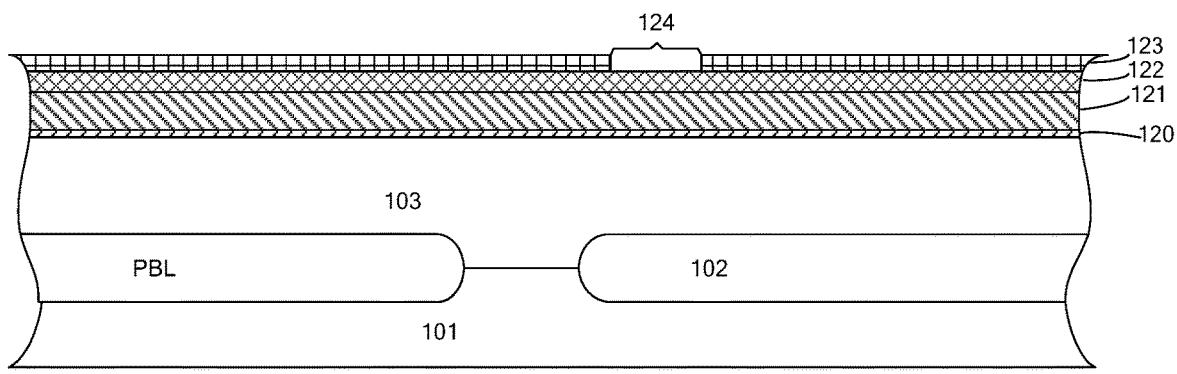

As shown in FIG. 5, a pad oxide layer 120, a nitride layer 121, a photoresist layer 122 and a mask layer 123 are sequentially formed on the epitaxial layer 103. The pad oxide layer 120 has a recommended thickness of a range of 120 A-500 A and the nitride layer 121 has a recommended thickness of a range of 500 A-1500 A. The pad oxide layer 120 may include silicon dioxide that is grown in a thermal oxidation process. The nitride layer 121 may include silicon nitride (e.g., Si3N4) that is deposited under a Low Pressure Chemical Vapor Deposition (LPCVD) furnace process. The mask layer 123 servers the function of a mask during the subsequent trench etch process, and it may be comprised of any material known in the art, and may be a hard mask or a soft mask, according to various embodiments. The mask layer 123 is patterned with an opening to the photoresist layer 122, defining a trench region 124. In one embodiment, the opening of the mask layer 123 has a recommended critical dimension of 1-2 um.

Figure 6:
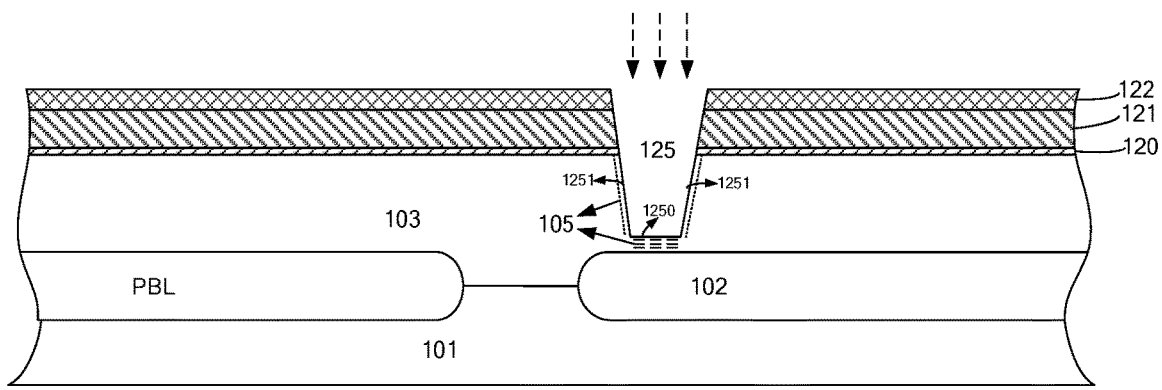

As shown in FIG. 6, a trench etch process is performed to form a trench 125. The trench etch process may include multiple subsequences. In one implementation, for example, an etch step may be first performed to remove the portion of the photoresist layer 122 exposed by the patterned mask 123 through lithography and/or other suitable technique, and a further etch may then be performed to remove the nitride layer 121, the pad oxide layer 120, and the epitaxial layer 103 that are exposed by the etched photoresist layer 122. In one embodiment, the epitaxial layer 103 has a recommended etching thickness of a range of 3-6 um. In one embodiment, the step of forming the trench comprises stopping etching the epitaxial layer 103 above the buried layer 102, that is, the etch step stops before reaching the buried layer 102. Yet in another embodiment, the step of forming the trench comprises stopping etching when reaching the buried layer 102.

As also shown in FIG. 6, the process further includes forming a sinker 105 in the epitaxial layer 103. The sinker 105 is formed by implanting N-type dopants through the bottom side 1250 and the side walls 1251 of the trench 125 with the photoresist layer 122 after removing the mask layer 123. In one embodiment, the implantation for N-doping in the epitaxial layer 103 may be repeated multiple times, for example, with a first series of steps of phosphorus (P) implantation at a first angle and respectively at a series of different energies, and with a second step of phosphorus (P) implantation at a second angle and at another energy. In one embodiment, adequate thermal process to anneal implant damage may be added afterwards. In further another embodiment, after the ion implantation step, the semiconductor device may be heat-treated to form a sacrifice oxide film on the inner surfaces, that is, the bottom side 1250 and the side walls 1251 of the trench 105. Persons of ordinary skill in the art will recognize that in the illustrated embodiment, the ion implanting step for forming the sinker 105 is performed with the photoresist layer 122, however, in another embodiment, this step may be performed without the photoresist layer 122, and in such the embodiment, a lighter energy may be used for the ion implantation. Persons of ordinary skill in the art will also recognize that the thermal anneal process mentioned above or below in the present invention may refer to a rapid thermal anneal process.

Figure 7:
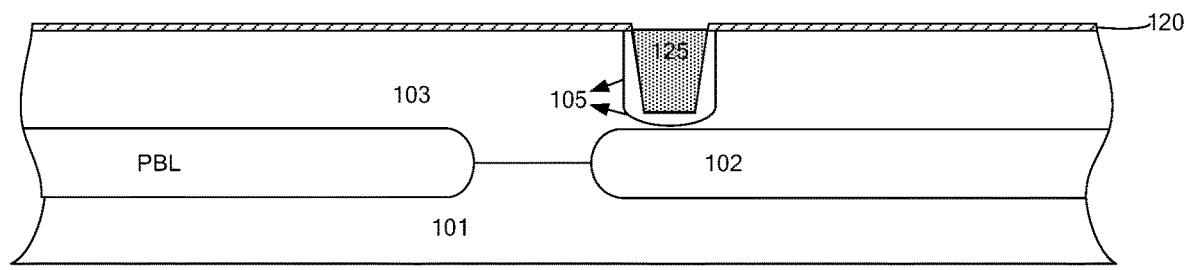

As shown in FIG. 7, the process includes filling the trench 125 with a non-conductive material, such as undoped poly or undoped oxide, and then the excess non-conductive material above the surface of the epitaxial layer 103 is removed such that the non-conductive material is substantially planarized with the surface of the epitaxial layer 103. This may be accomplished, for example, by etch-back and/or chemical mechanical planarization (CMP). Further, the process includes removing the photoresist layer 122 and the nitride layer 121.

Figure 8:
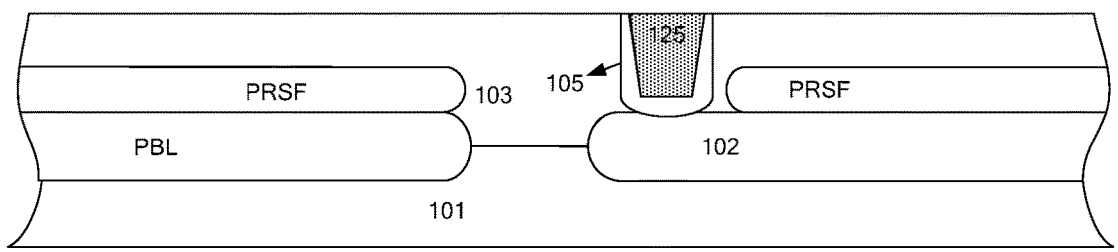

As shown in FIG. 8, the process includes forming a P-type RESURF layer PRSF in the epitaxial layer 103, wherein the RESURF layer PRSF is formed on top of the N-type buried layer 102. In the embodiment of FIG. 8, a P-type buried layer PBL is also formed in the epitaxial layer 103. In such the embodiment, the RESURF layer PRSF can be also formed on top of the P-type buried layer PBL besides on the N-type buried layer 102. Persons of ordinary skill in the art will recognize that in another embodiment, there may be no P-type buried layer in the epitaxial layer 103, and thus no RESURF layer PRSF formed on a P-type buried layer. The step of forming the RESURF layer PRSF may be implemented by the ion implantation with a mask. Also, the thermal treatment of the P-type RESURF layer PRSF is recommended in order to cure silicon damage from high energy implantation. In one embodiment, the RESURF layer PRSF can be formed contacting the buried layer 102, yet in another embodiment, the RESURF layer PRSF can be separated from the buried layer 102.

As also shown in FIG. 8, the process includes removing the pad oxide layer 120 after the RESURF layer PRSF is formed. Persons of ordinary skill in the art will recognize that in the embodiment illustrated in FIG. 7 and FIG. 8, the pad oxide layer 120 is removed after the RESURF layer PRSF is formed, however, in another embodiment, the pad oxide layer 120 may be removed after the nitride layer 121 is removed and before the RESURF layer PRSF is formed.

Figure 9:
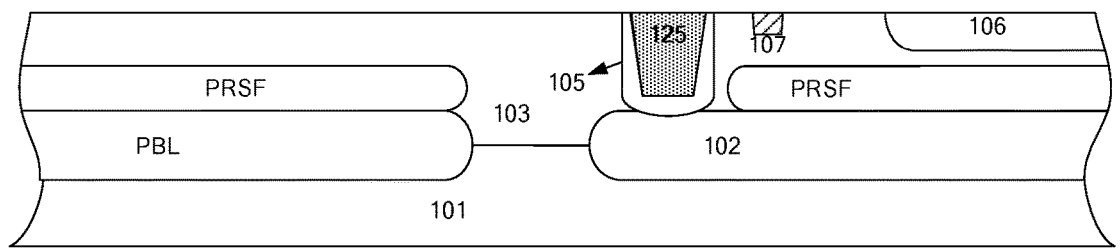

As shown in FIG. 9, the process includes forming a drain drift region 106 with N-type doping in the epitaxial layer 103, wherein the drain drift region 106 is above part of the RESURF layer PRSF. In one embodiment, the drain drift region 106 is formed separated from the RESURF layer PRSF, yet in another embodiment, the drain drift region 106 is formed contacting the RESURF layer PRSF. In one embodiment, the drain drift region 106 may be formed by the ion implantation technology. Adequate thermal process to anneal implant damage and to drive-in the drain drift region 106 may be added.

As also shown in FIG. 9, the process may optionally include forming a field region 107 in the epitaxial layer 103. In one embodiment, the field region 107 is formed as shallow trench isolation (STI) structure.

Figure 10:
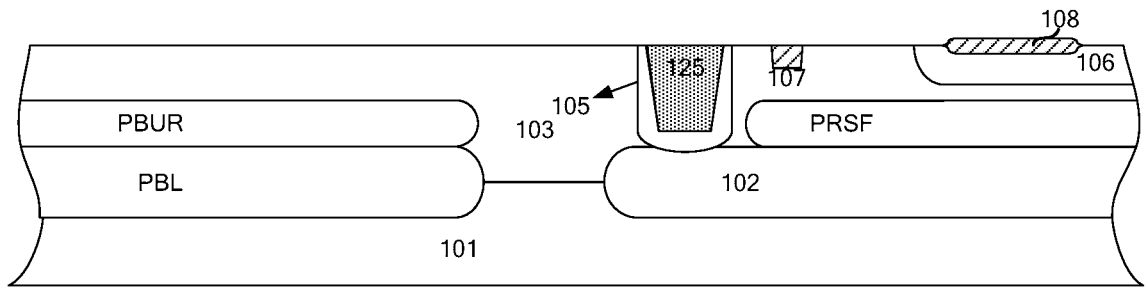

As shown in FIG. 10, the process may optionally include forming a thermal oxide field plate 108 on part of the drain drift region 106.

Figure 11:
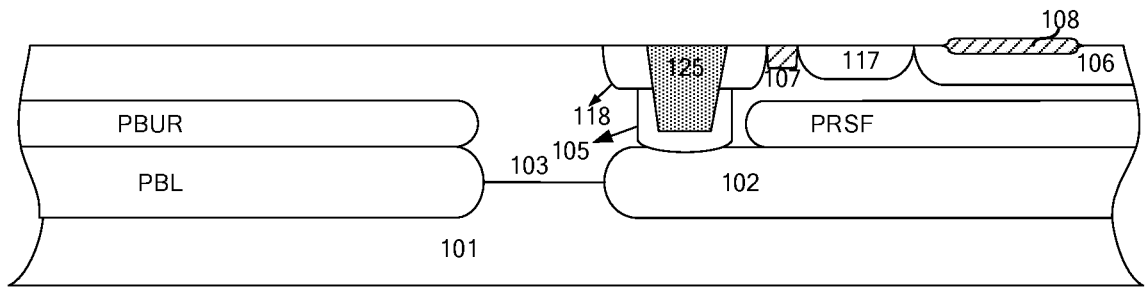

As shown in FIG. 11, the process includes forming a body region 117 and an N-type well region 118 in the epitaxial layer 103. The N-type well region 118 is formed surrounding the trench 125 and contacting the sinker 105 and the top surface of the epitaxial layer 103. The body region is formed contacting the drain drift region 106. The body region 117 and the N-type well region 118 are respectively located at a first side and a second side of the field region 107. In one embodiment, the well regions may be formed by the ion implantation technology. Adequate thermal process to anneal implant damage and to drive-in the well regions can be added.

Figure 12:
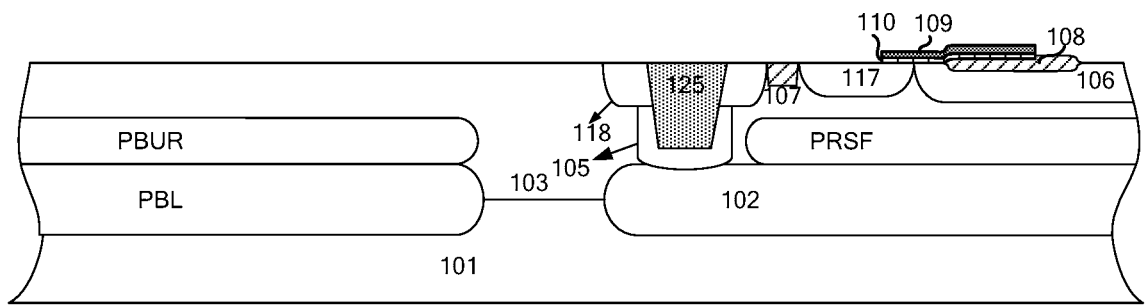

As shown in FIG. 12, the process includes forming a thin gate oxide 110 covering a portion of the body region 117 as well as a portion of the thermal oxide field plate 108. In one embodiment, the thin gate oxide 110 may be formed by dry oxidation technology. In one embodiment, the thickness of the thin gate oxide 110 ranges from 70 A to 250 A. As also shown in FIG. 12, the process includes forming a gate poly 109 on the thin gate oxide 110.

Figure 13:
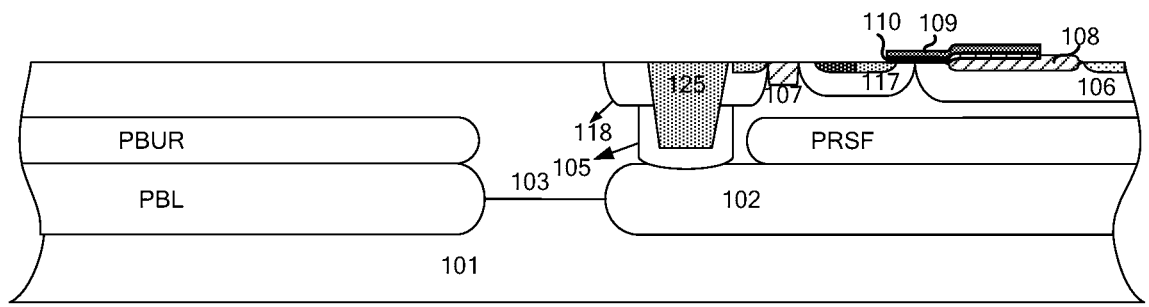

As shown in FIG. 13, the process includes forming a drain pickup region with N-type doping in the drain drift region 106, a source pickup region with N-type doping and a body pickup region with P-type doping in the body region 117, a pickup region with N-type doping in the well region 118, and wherein the source pickup region and the body pickup region are adjacent to each other. In one embodiment, the pickup regions are formed by implantation technology. Adequate thermal process to anneal implant damage and to drive-in the pickup regions can be added.

Although not shown in drawings, persons of ordinary skill in the art will recognize that the process also includes forming a plurality of electrodes contacted with the pickup regions and with the gate poly.

In the above embodiments, with the trench 125 formed in the sinker 105, the sinker 105 can be more easily formed by implanting ions through the bottom side and the sidewalls of the trench 125, resulting an easier and better link between the first well region 118 and the buried layer 102. This is especially useful in an LDMOS device with a thick epitaxial layer due to, for example, a RESURF layer.

This written description uses examples to disclose the invention, including the best mode, and also to enable a person skilled in the art to make and use the invention. The patentable scope of the invention may include other examples that occur to those skilled in the art.

What is claimed is:

1. An LDMOS device, comprising:
    a substrate;
    an epitaxial layer formed on the substrate and has a top surface;
    a body region formed in the epitaxial layer, wherein the body region has a first side and a second side;
    a drain drift region formed in the epitaxial layer, wherein the drain drift region is adjacent to the body region at the first side;
    a gate formed on the epitaxial layer, wherein the gate covers a portion of the body region and a portion of the drain drift region;
    a buried layer formed in the substrate and contacting the epitaxial layer;
    a first well region formed in the epitaxial layer and at the second side of the body region, and wherein the first well region is separated from the body region;
    a sinker formed between the buried layer and the first well region and contacting the buried layer and the first well region; and
    a trench extending from the top surface of the epitaxial layer, through the first well region and into the sinker.

2. The LDMOS device of claim 1, wherein the trench is filled with non-conductive material.

3. The LDMOS device of claim 2, wherein the non-conductive material comprises undoped oxide or undoped poly.

4. The LDMOS device of claim 1, wherein the trench extends from the top surface of the epitaxial layer to a horizontal plane defined by the most upper side of the buried layer.

5. The LDMOS device of claim 1, wherein the trench extends from the top surface of the epitaxial layer into the sinker and above a horizontal plane defined by the most upper side of the buried layer.

6. The LDMOS device of claim 1, further comprising a reduced surface field layer formed between the buried layer and the drain drift region.

7. The LDMOS device of claim 1, further comprising a shallow trench isolation structure formed between the body region and the first well region.

* * * * *